United States Patent [19]

Gibson et al.

[11] Patent Number: 4,998,664

[45] Date of Patent: Mar. 12, 1991

[54] BOND SIGNATURE ANALYZER

[75] Inventors: Owen E. Gibson, Arivaca; William J. Gleeson; Larry D. Burkholder, both of Tucson, all of Ariz.; Bradley K. Benton, Carlsbad, Calif.

[73] Assignee: Hughes Aircraft Company, Los Angeles, Calif.

[21] Appl. No.: 455,706

[22] Filed: Dec. 22, 1989

[51] Int. Cl.$^5$ .................... B23K 20/10; H01L 21/607
[52] U.S. Cl. .................................. 228/102; 228/103; 228/8
[58] Field of Search .................... 228/103, 179, 4.5, 8, 228/102; 340/635, 660, 664

[56] References Cited

U.S. PATENT DOCUMENTS

| | | |
|---|---|---|
| 3,445,750 | 5/1969 | Uthe . |
| 3,636,456 | 1/1972 | Wright . |
| 3,693,158 | 9/1972 | Uthe . |
| 3,852,999 | 12/1974 | Wright . |
| 3,934,108 | 1/1976 | Howard . |
| 4,815,001 | 3/1989 | Uthe et al. ........................ 228/103 |
| 4,824,005 | 4/1989 | Smith, Jr. . |

OTHER PUBLICATIONS

"Monitoring System Instantly Detects Wire Bonding Defects", article, 1986.
"Non-Destructive Monitoring of Ultarsonic Bond Quality", article by R. V. Winkle, pp. 83–86, 5–1982.

Primary Examiner—Sam Heinrich
Attorney, Agent, or Firm—Terje Gudmestad; Jeannette M. Walder; Wanda K. Denson-Low

[57] ABSTRACT

A feedback signal of an ultrasonic generator (13) employed in a ball bonder (11) is sampled by an analog-to-digital converter (23) under control of a microprocessor (25) to provide a "bond signature" indicative of bond quality. The microprocessor (25) then compares the bond signature to limits representing a good quality bond to provide an indication of a good or failed bond. The indication may be visually provided by projecting the bond signature and limits on a display (27), as well as automatically provided by a programmed comparison.

19 Claims, 2 Drawing Sheets

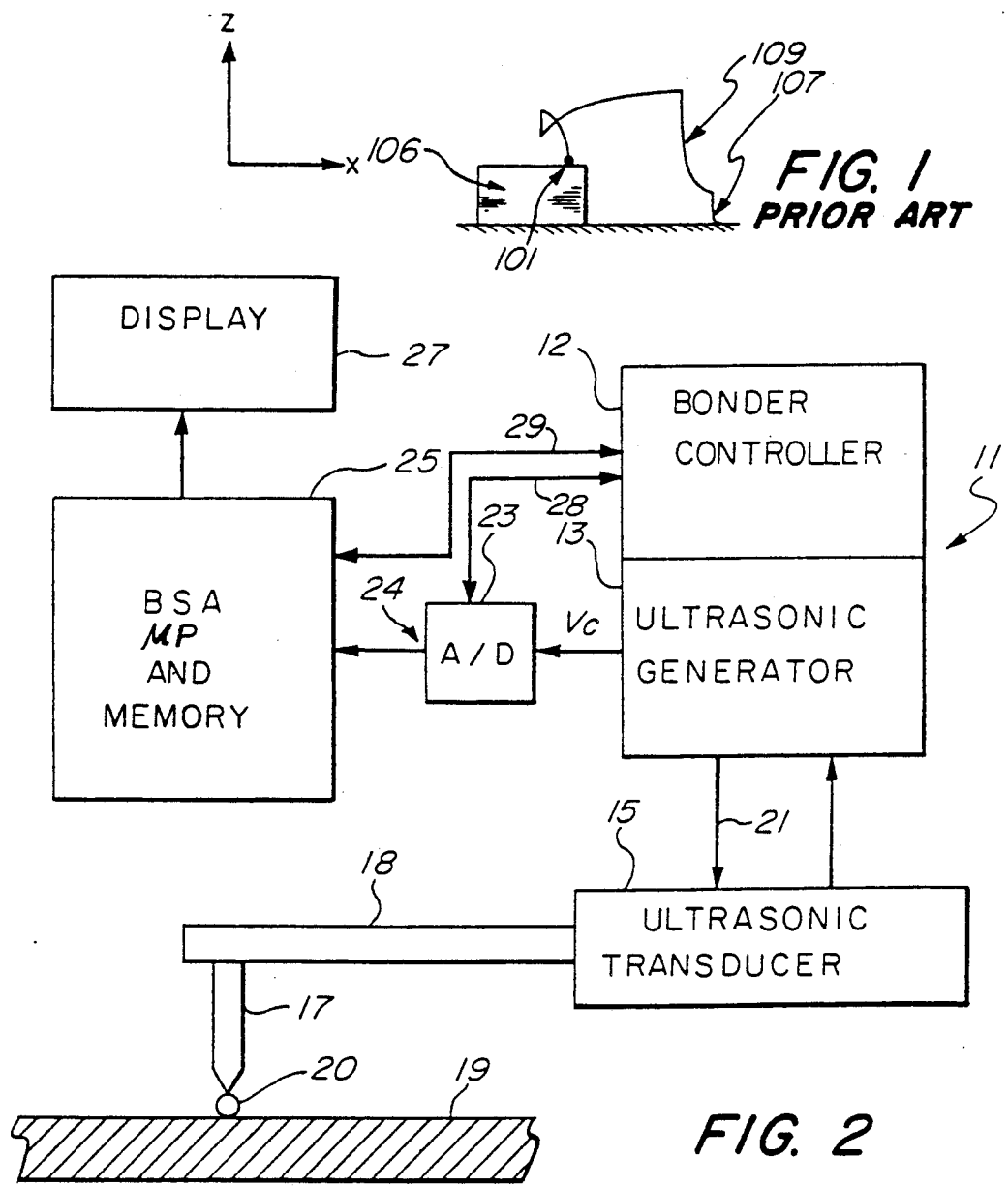
FIG. 1 PRIOR ART
FIG. 2
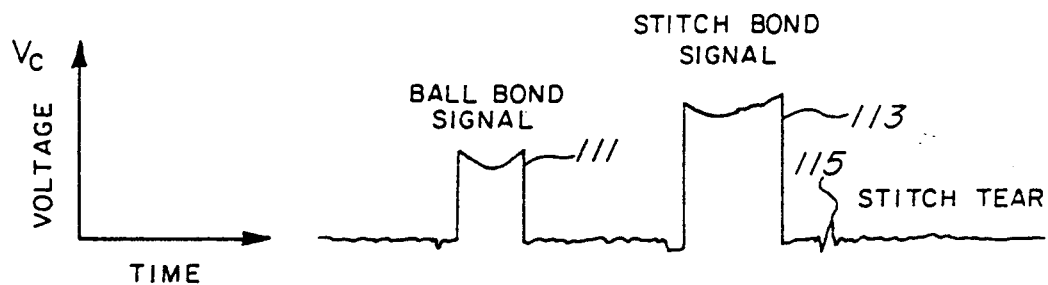
FIG. 3

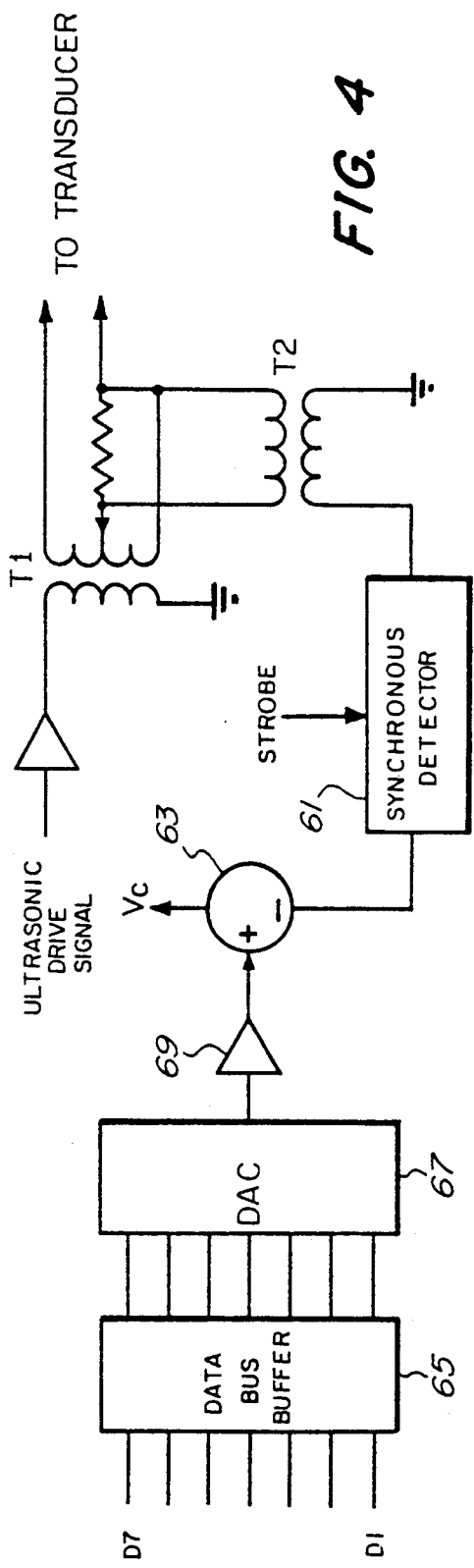
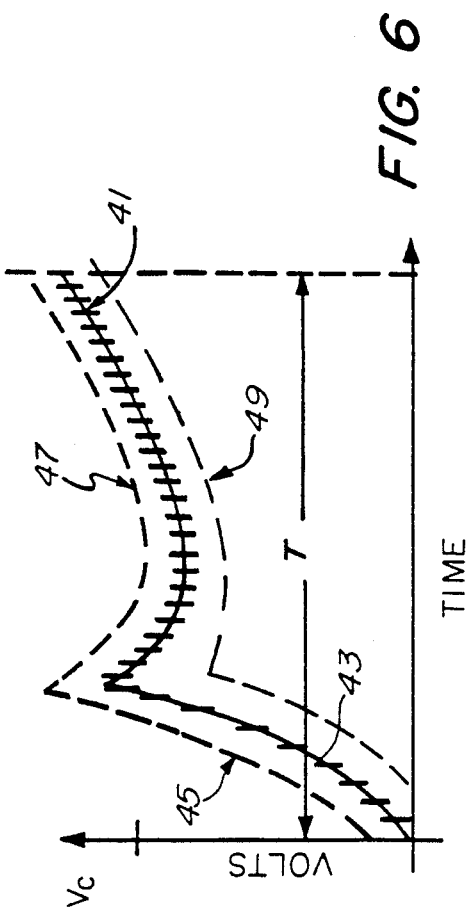
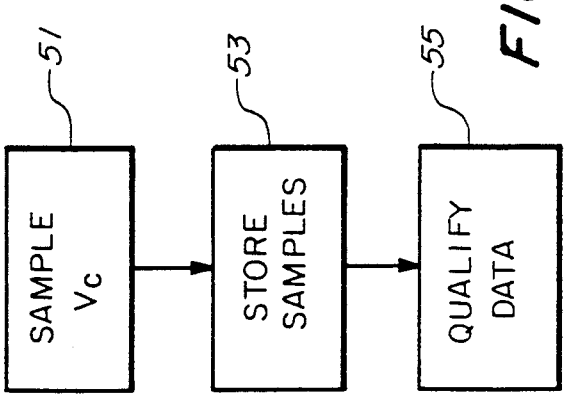

BOND SIGNATURE ANALYZER

BACKGROUND OF THE INVENTION

1. Field of the Invention

The subject invention relates generally to electrical circuit fabrication and, more particularly, to a method and apparatus for determining the integrity of wirebonds formed by wirebonding apparatus.

2. Description of Related Art

Presently, wirebonding to integrated circuitry is performed by several methods, including ball bonding and wedge bonding. A typical ball bonding operation forms a "ball bond" to an IC and a "stitch bond" to a second bond site, followed by a "stitch tear."

Various defects are known to occur in such ball bonding procedures, including lifted balls, misregistered balls, improper ball size, cratering, and defective stitches. The "lifted" ball bond does not adequately weld to the die bond pad or conductor. Contamination or a misapplication of the bond force component is usually the cause of lifted balls. The misregistered ball is placed disproportionately on the ball bond pad site and an adjacent material, typically either silicon dioxide glassivation or dielectric. Hence, only a portion of the entire ball bond area is actually welded during the bond cycle. Additionally, the ball bond size may be either too small or too large.

A cratered die bond pad occurs explosively during the ball bond cycle. Adequate coupling takes place in the early stages of the ball bond cycle, then suddenly, high shear forces cause the underlying silicon to break away. The ball bond is thus left unsupported.

Defective stitches include cut stitches and lifted stitches. With a cut stitch, the wire tail has already been released from the bond site due to overbonding. On the other hand, with the lifted stitch, the wire at the stitch has been underbonded and a greater force is required to separate the wire tail from the stitch end of the bond.

Given the foregoing and other potential defects, wirebonds formed by wirebonding apparatus are typically required to go through laborious and expensive testing. For example, current military requirements specify internal visual inspection for determining the integrity of wirebonds and other microcircuit interconnections. Visual inspection of wirebonds has become a costly task, for example, requiring approximately eight inspection stations operating two shifts per day at some facilities. Production operators at these stations may review hundreds of thousands of initial build wirebonds and rework build wirebonds in a normal week. Some military requirements also require a 100% nondestructive wire pull test of all wirebonds. Wire pull takes longer than visual inspection and is prone to cause damage to the product. Another useful test is the simple determination of the presence of a wire in the bond tool during bonding, e.g., during wirelooping and stitch bond formation.

All of the foregoing extensive testing results in detection of a relatively small number of defective wirebonds. For example, the quantity of defective wirebonds on initial-build hybrids at one typical facility was calculated at 0.24% of the total quantity of wirebonds installed. In this instance, the capability to identify bonds likely to be visually marginal would effectively reduce the quantity of wirebonds required to be inspected and dispositioned for rework from 16,250,000 bonds to only 39,000 bonds on initial build hybrids

SUMMARY OF THE INVENTION

Accordingly, it is an object of the invention to provide an improved method and apparatus for detecting defective wirebonds;

It is another object of the invention to reduce or eliminate the need for visual inspection of wirebonds;

It is another object of the invention to reduce or eliminate or reduce the need for 100% wire pull tests of wirebonds;

It is another object of the invention to provide an improved method and apparatus for detecting defective wirebonds which is automated and suitable for application in expert systems;

It is another objective of the invention to provide an improved method and apparatus for use in wirebond process (bond schedule) generation and control; and It is another objective of the invention to provide an improved method and apparatus useful for maintenance and field service repairs.

According to the invention, a signal containing information indicative of bond quality is tapped from the wirebonder control system and is sampled and digitally processed to determine bond quality. The tapped signal is a signal indicative of power coupled to the bond site. For example, the signal may be one indicative of changes in feedback required to stabilize ultrasonic energy used to vibrate a bonding tool during the bonding process.

BRIEF DESCRIPTION OF THE DRAWINGS

The just-summarized invention will now be described in detail in conjunction with the drawings, of which:

FIG. 1 is a schematic diagram useful in illustrating a prior art wirebonding procedure;

FIG. 2 is a schematic block diagram illustrating the preferred embodiment;

FIG. 3 illustrates bond signatures related to the wirebonds of FIG. 1;

FIG. 4 is a circuit diagram of circuitry for providing a signal representative of power coupled to a bond site;

FIG. 5 is a flowchart illustrating bond signature analysis according to the preferred embodiment; and FIG. 6 is a graph depicting a bond signature display according to the preferred embodiment.

DESCRIPTION OF THE PREFERRED EMBODIMENTS

FIG. 1 illustrates Z axis tool motion in a typical ball bonding procedure. A first ball bond 101 is made to a component 106, the wire is pulled off, looped 109, and moved to a second bond site, e.g., a terminal lead. At the second bond site, the second or "stitch" bond 107 is made, and the wire is flamed off. The flame-off process includes the steps of pulling the tail after the second bond is made, closing the wire clamp and breaking the tail off the second bond 107, moving to the flame-off position, and firing the flame-off system. Generally, the ball bond 101 is made to an IC pad and the stitch bond 107 to substrate gold, but reverse bonding can be done, as known in the art.

A wirebonder 11 employing an ultrasonic generator 13 for performing such wirebonding is shown schematically in FIG. 2. One such commercially-available wirebonder 11 is the Model HMC 2460 thermosonic wirebonder available from Hughes Aircraft Company. An ultrasonic generator which has been employed in that wirebonder is one manufactured by Orthodyne Inc. of Costa Mesa, CA. The wirebonder 11 of FIG. 2 further includes an ultrasonic transducer 15, an ultrasonic feedhorn 18, and a bond tool or capillary 17. Mechanical force and ultrasonic energy are applied to the capillary 17 to create a wirebond between a bond surface 19 and a gold ball 20 having a diameter of, e.g., 0.7 to 2.0 mils. Wirebonding by the bonder 11 is controlled by a controller 12 which, in the HMC 2460 bonder, comprises a number of programmed microprocessors.

In operation, the wirebonder 11 applies heat to the bond site via a heated stage located underneath the bond surface 19. Force is applied by pressing the capillary 17 down toward the bond surface 19. An ultrasonic signal is generated by the generator 13 and converted to a mechanical ultrasonic frequency vibration of the feedhorn 18 by the transducer 15. The capillary 17 transmits the ultrasonic energy and downward force, effectively "scrubbing" the gold ball 20 against the bond surface 19. The combination of heat, force and ultrasonic vibration causes bonding between the bond surface 19 and the gold ball 20.

As the capillary 17 presses the gold ball 20 into the bond surface 19, the amplitude of the ultrasonic vibration imparted through the feedhorn 18 is dampened according to the coefficient of coupling between the tool 17 and the gold ball 20 and between the gold ball 20 and the bond surface 19. This coefficient of coupling varies with the type of material, force, temperature, contamination and other variables.

A feedback loop in the ultrasonic generator 13 detects any variation in the resonance of the ultrasonic feedhorn 18. The feedback system then controls the energy to the feedhorn to provide the desired ultrasonic oscillation. The feedback loop of the ultrasonic generator 13 generates a DC feedback correction signal $V_C$, which is tapped to provide a direct indication of the mechanical coherence between the transducer 15, the tool 17 and the bond surface 19.

According to the preferred embodiment, this voltage $V_C$ is converted into a sequence of digital values by an off-the-shelf analog-to-digital converter apparatus 23, such as Part No. DAS 16G available from Metrabyte Corp. of Taunton, MA. This voltage $V_C$ over time for a particular bond is referred to as the "bond signature" of that bond. In the preferred embodiment, the digital representation of the analog waveform $V_C$ at the output 24 of the A/D converter 23 comprises a series of digital samples which represent the signal $V_C$ over time. These samples are taken and analyzed under control of a BSA microprocessor 25 to determine bond quality. The BSA microprocessor is preferably an IBM personal computer (PC) or PC compatible clone.

The signal $V_C$ is a representation of the power coupled to the bond site. This power varies with conditions at the bond site, i.e., the aforementioned "coefficient of coupling" and, hence, incorporates both the drive function provided to the tool 17 and the real world reaction to the drive function. In the preferred embodiment, both the ball and stitch bonds 101, 107 are made in what is referred to as the constant current mode.

As illustrated in FIG. 4, in a constant current mode embodiment, the signal $V_C$ is generated from a signal produced by applying a sample of the transducer current taken by a transformer T2 to a synchronous detector 61 to generate a D.C. level directly proportional to the amplitude level of the tool 17. The D.C. level is then applied to a summing amplifier 63 which, in the constant current mode, subtracts the D.C. level from the nominal D.C. level set by a computer and outputs the correction signal $V_C$. The nominal D.C. level is set in a data buffer 65, converted to analog form by a digital-to-analog converter 67, and applied through an amplifier 69 to the summing amplifier 63. An ultrasonic generator employing such circuitry is disclosed in U.S. Pat. No. 4,824,005 incorporated by reference herein.

Another mode of ultrasonic generator operation well-known to those skilled in the art is the constant voltage mode operation. The signal $V_C$ can also be derived in this mode. In general, those skilled in the art will appreciate from the foregoing that various signal points in various ultrasonic generators can provide a signal or bond signature "representative of the power coupled to the bond site," as that phrase is used in this disclosure.

FIG. 3 shows an "ideal" bond signature resulting from the procedure of FIG. 2. An ideal bond signature shows a positive slope at the ball and stitch bond indicating an increasing transducer voltage drive function requirement at these points. This is believed to be caused by (1) an increase in cross-sectional area of the bond and increased tool contact as the capillary force is applied downward, and (2) an increase in the rigidity of the bond caused by the welding action of the mating surfaces. The ideal stitch bond signature 113 has a voltage requirement characteristic similar to the ideal ball bond signature 111, but is usually of greater magnitude.

An added signal on the stitch side of the bond sequence is the stitch tear spike 115 (FIG. 3). Following the formation of the stitch bond, the bond head raises up slightly, leaving a small wire tail. The wire clamping mechanism closes, and the bond head moves rapidly upward. This operation releases the wire tail from the stitch bond, while leaving a portion of wire hanging out of the capillary for subsequent flame-off and ball formation. This parting action between the wire tail and the previous stitch bond leaves a characteristic spike 115 in the bond signature.

The bond signatures of various defective bonds differ from those of "good" bonds. The lifted ball bond does not adequately weld to the die bond pad or conductor, and, with some bonding tools, no additional transducer voltage requirement is seen in the bond signature. A misregistered ball may result in a flatter transducer voltage requirement because only a portion of the entire ball bond area was actually welded during the bond cycle. The insufficient/excessive size ball bond will take lower and higher transducer voltage requirements, respectively.

With the cratered die bond pad, adequate coupling takes place in the early stages of the ball bond cycle, then suddenly, high shear forces cause the underlying silicon to break away. The ball bond is unsupported and the voltage requirement drops rapidly.

A cut stitch has a different signature when compared to the normal stitch because the wire tail has already been released from the bond site due to over-bonding. On the other hand, the lifted stitch bond gives a different tear signature because the wire at the stitch has been underbonded and a greater force is required to separate the wire tail from the stitch end of the bond, which may not occur if the stitch does not stick adequately.

Thus, by examining bond signatures one may distinguish a "good" bond from a defective one. The preferred embodiment implements analysis of bond signatures under microprocessor control, integrated with the bond sequence of the bonder 11 of FIG. 2.

A bond sequence (BS) employing the HMC 2460 bonder according to the preferred embodiment proceeds as follows. Except for Steps BS 3, BS 11 and BS 14, the following procedure is conventional.

Step BS 1: The X/Y table of the bonder is driven to a first bond position and the bonding tool 17 is moved along the Z axis to the "search" position at high speed with medium force. A first bonding force is applied and the tool 17 continues its Z motion at a first bond search speed to the bonding surface, where bond 101 is to be formed.

Step BS 2: Delay 10–15 milliseconds.

Step BS 3: The BSA processor 25 is triggered to begin acquiring data. The HM 2460 control processor 12 ramps up the power level of the ultrasonic generator 13 to the programmed level and continues to apply ultrasonic energy for the programmed first bond time (typically 20–40 msec) during which the ball bond 101 is to be formed. During this first bond time, the BSA processor 25 has controlled the A/D converter 23 to cause sampling of the bond signature $V_C$ and has caused storage of the samples in random access memory (RAM) or on disk or both, as discussed in more detail below. A 10-msec sampling period, starting at the beginning of the first bond time, has been used with success, although other periods can be used, depending upon the analysis desired.

Step BS 4: The bonder controller 12 turns off ultrasonic energy, reduces force, and moves the bonding tool 17 up off the first bond 101. The Bond Signature Analysis system is done capturing data before the end of BS 3. The system can be commanded to capture data into BS 4, but normally it is not.

Steps BS 5–8: The X/Y/Z positioning system moves the tool through various programmable "loop" modes to shape the wire as it is fed out. The X/Y position is at the second bond position 107 at the end of these sequences.

Step BS 9: As in Step BS 1, the tool is moved to search height at high speed with medium force. The second bonding force is applied and the Z axis motion continues to the bonding surface at search speed, where bond 107 is to be formed. p0 Step BS 10: Delay 10–15 milliseconds.

Step BS 11: The BSA processor 25 again begins acquiring data. Ultrasonics energy is again ramped up to the programmed level and applied for a programmed second bond time.

Step BS 12: As in BS 4, ultrasonic energy is turned off. The BSA processor 25 is done capturing data. The tool moves along the Z-axis to tail pull position.

Step BS 13: The wire clamp is closed, followed by a short delay.

Step BS 14: The BSA processor 25 captures tail-pull information as the tool moves to EFO (electric flame-off) position.

Step BS 15: The EFO wand is energized and a delay (for settling) occurs.

Step BS 16: The EFO is fired for a programmable amount of time.

Step BS 17: Short delay.

Step BS 18: Turn off the EFO wand.

Step BS 3, implementing the preferred embodiment, will now be described in more detail in connection with FIGS. 5 and 6. FIG. 5 is a flow chart illustrating the bond signature analysis procedure, while FIG. 6 illustrates an analog bond signature $V_C$ plotted as curve 41.

In Step 51 of FIG. 5, the A/D converter 23 samples the $V_C$ curve 41, as indicated by the vertical hash marks along curve 41 in FIG. 6. As illustrated, $V_C$ typically ramps up, peaks, and then slowly ramps up again for the period of the ball bond 101. The initial ramp-up is coincident with the ramping up of ultrasonic energy. The A/D converter 23 is controlled by the BSA processor 25 to sample a selected period of from one to hundreds of milliseconds at a sampling rate of from DC to 70 kHz with the Metrabyte A/D card, with a maximum of 256 samples normally being taken. Many more samples could be taken at the expense of speed. The processor 25 is programmed to supply a start signal to the A/D converter 23, as well as signals indicative of the sampling frequency and sample number, as hereafter described in more detail. The processor 25 also selects an A/D gain setting, e.g., 1, 2, 4 or 8×, to ensure the display fits on the CRT display 27.

The acquisition of data, i.e., sampling of $V_C$, is controlled as follows. The bonder controller 12 supplies one of three control or toggle signals $T_0$, $T_1$, $T_2$ to parallel control lines 28. These control lines 28 supply the respective signals $T_0$, $T_1$, $T_2$ to the A/D converter 23, while control lines 29 allow communications between the controller 12 and the BSA processor 25. These signals indicate that the bonder 11 is preparing to perform the ball bond, stitch bond, or tail formation, respectively. The signals $T_0$, $T_1$, $T_2$ cause sampling by the A/D converter 23 to begin. For example, when the signal $T_0$ appears, the A/D converter 23 samples the ball bond signature. The sampling rate and number of samples is set by a command line in the BSA processor 25. For example, the symbol pairs b, x; s, y; and t, z; may be used to denote the respective sample number and sample frequency assigned to each respective control signal $T_0$, $T_1$, $T_2$. Accordingly, selected sample numbers b, s, t and sample frequencies x, y, z are programmed for acquisition of each of the respective ball, stitch, and tail formations.

In Step BS 3, the BSA processor 25 causes the A/D converter 23 to take each sample as described, and causes each sample to be stored in random access semiconductor RAM with the option to store to disk later, Step 53 of FIG. 5. The processor 25 then begins a procedure to qualify the data, i.e., to determine if the samples of $V_C$ fall within acceptable limits. The processor 25 acquires and stores the samples in a high speed direct memory access (DMA) mode, well-known to those skilled in the art.

In Step 55, the data is qualified. The qualification procedure is performed before Step BS 4, i.e., well before the second bond is made. Optionally, qualification can be performed between each wire. In this manner, it may be determined whether one wire was properly bonded before bonding of another wire begins. Failure information is supplied to the controller 12 from the BSA processor 25 over serial communications lines 29.

To qualify the data according to the presently preferred embodiment, sampled data is displayed on the CRT display 27, resulting in a display of points following, for example, the curve 41 illustrated in FIG. 6. These points represent changes in feedback within the ultrasonic system 13. The limits 45, 49 define a "window" within which acceptable results fall. The limits 45, 49 are drawn on the display screen 27 with a mouse according to conventional procedures, providing a visual indication of whether the bond was acceptable. In an embodiment presently intended for commercial use, the limits 45, 49 are determined heuristically. Limit line or curve 49 is typically spaced the same distance from the ideal bond signature line 41 as limit line 45. The heuristic limit curves 45, 49 may be determined by looking at the limits within which a dozen or so good bonds fall, and may be further refined by looking at the signatures of a few failed bonds. In addition to the visual indication provided by the display 27, the BSA processor 25 automatically determines whether or not a sampled value of $V_C$ falls outside the limits 45, 49 by a standard compare operation.

In an alternative embodiment, the BSA processor is programmed to learn the tolerance levels represented by limit lines 45, 49 through examination of the limits within which the samples of the signatures of a selected number of good bonds fall. The processor 25 again does a limit comparison to detect a failure automatically. A failure signal is generated and brought to the user's attention either audibly or visually or by stopping the bonding equipment. The processor 25 may also be programmed to implement other qualifying analyses, such as "area under the curve," slope angle, and so forth. A "failure mode" may also be defined programmatically by limits 45, 49 and tested for by the BSA computer 25. For example, counting of 30 points in a row outside the window defined by limits 45, 49 may be defined as a failure. One may then define how many such failures are required to generate a failure event and, hence, a failure signal.

The procedure of BS 3 is again followed in Step BS 11 and step BS 14.

The just-described procedure for controlling the A/D converter 23 and qualifying the data could be incorporated in the HMC 2460 microprocessor controller 12 rather than in a separate processor 25, as shown in FIG. 1. The procedure according to the preferred embodiment employing heuristically determined limits has resulted in detection of 98.2% of "no stick" failures, wherein the ball 20 does not stick to the substrate 19, and about 90% of all failure modes. The method according to the preferred embodiment is also applicable to wedge and TAB (tape automated) bonding and to various other welding and bonding processes.

According to the preferred method, only those bonds with unsatisfactory signatures need be subjected to a pull strength test and visual inspection, greatly reducing cost. Also according to the preferred method, the absence of a wire is positively detected because the bond signature generated will be unacceptable, i.e., out of limits.

Numerous additional features, modifications, and adaptations may be provided without departing from the scope and spirit of the invention. Various command switches can provide numerous user-selectable manipulations of the data samples. For example, a command switch may be provided to transfer any waveform out to a CRT or printer. A command switch may be provided to cause any large discontinuities to be smoothed out. A sensitivity check can be provided, for example, if the tolerance is within "5 millivolts" do not use smoothing. All programs are preferably such that the numeric limits can be changed.

A command switch may be provided to perform a Bezier smoothing algorithm with a weighted forward and backward look, such algorithm itself being known in the art. An averaging capability may also be provided to do a prime average calculation.

Whether a signature "passes" may be judged by several methods. For example, 1,000 ball or stitch signatures may be captured and displayed all at once, giving a known readable high and low. Then a mouse can be used on the display screen to specify upper and lower control limits, similar to the approach described above. Another technique, readily implementable in the processor 25, is to use standard XR (X bar R) analysis with a window at "$\frac{1}{2} \sigma$" or a "$\sigma$" off of the 1,000 samples.

Additionally, since the A/D card 23 has 16 inputs and is a 16-channel switch, it may receive inputs from several bonders or several other inputs such as force, temperature, etc., from just one bonder. In such an application, the switches are closed by the microprocessor 25, according to its particular programming.

The preferred embodiment thus admits of numerous advantages. It detects improper bonds, signifies failure in the absence of a wire in the bonding tool, and significantly reduces the need for visual inspections, pull, and strength tests, setup, process generation and control, maintenance, and field service. A menu of acceptable signals may be provided, resulting in a system which is user-programmable to allow for changes in materials, bonding tools and machine settings. Such a system may further disposition circuits for rework or visual bond inspection automatically based upon unacceptable bond signatures.

The system of the preferred embodiment suggests itself for application in testing for unacceptable ultrasonic characteristics and signalling for tooling changes only when they are warranted. The approach also suggests itself for artificial intelligence applications and expert systems.

As is apparent, the described preferred embodiment admits of numerous modifications and adaptations without departing from the scope and spirit of the invention. Thus, within the scope of the appended claims, the invention may be practiced other than as specifically described herein.

What is claimed is:

1. For use with apparatus for forming wirebonds at selected bond sites wherein power is applied to the bond sites during formation of said wirebonds, the improvement comprising:
   means for deriving an analog signal representative of the power coupled to the bond site; and
   means for sampling said analog signal and determining bond quality from the sampled signal, said sampling means comprising analog-to-digital converter means responsive to a first control signal for sampling said analog signal at a frequency selected by a second control signal to generate a series of digital samples; and digital processor means for supplying said first and second control signals and for receiving and storing said samples;
   wherein said apparatus forms a ball bond and wherein said digital processor means includes means for generating a first toggle signal indicative of the beginning of formation of said ball bond, and wherein said analog-to-digital converter means is responsive to said first toggle signal to sample said analog signal during formation of said ball bond;
   wherein said apparatus forms a second bond after formation of said ball bond, wherein said digital processor means generates a second toggle signal indicative of the beginning of formation of said second bond, and wherein said analog-to-digital converter means is responsive to said second toggle signal to sample said analog signal during formation of said second bond; and wherein said apparatus forms a tail and wherein said digital processor means includes means for generating a third toggle signal indicative of the beginning of formation of said tail, and wherein said analog-to-digital converter means is responsive to said third toggle signal to sample said analog signal during formation and tear of said tail.

2. The apparatus of claim 1 wherein said digital processor means is responsive to said first, second, and third toggle signals to control the number of samples taken and the frequency of sampling during said ball formation, stitch formation, and tail formation, respectively.

3. The apparatus of claim 2 wherein said digital processor means includes display means and means for displaying said samples and a limit curve on said display means.

4. The apparatus of claim 3 wherein said digital processor means automatically compares said samples to said limit curve and provides an indication of pass or fail to a user.

5. The apparatus of claim 4 wherein said limit curve is heuristically determined.

6. The apparatus of claim 4 wherein said digital processing means automatically determines said limit curve.

7. The apparatus of claim 4 wherein pass or fail is determined by said processor means according to a failure mode definition comprising a number of failed point clusters in a selected window.

8. A wirebonder comprising:
   a bonding tool;
   an ultrasonic generator employing a feedback loop to control the application of ultrasonic energy to the bonding tool and wherein said feedback loop generates a DC feedback correction signal which is indicative of the changes in feedback required to stabilize the ultrasonic energy used to vibrate the bonding tool during the bonding process;
   means for sampling said DC feedback correction signal to produce a plurality of samples; and
   means for determining bond quality from said samples.

9. The wirebonder of claim 8 wherein said bonding tool forms a ball bond and said sampling means generates a first toggle signal indicative of the beginning of formation of said ball bond; wherein said bonding tool forms a second bond after formation of said ball bond and said sampling means generates a second toggle signal indicative of the beginning of formation of said second bond; and wherein said bonding tool forms a tail and said sampling means generates a third toggle signal indicative of formation and tear of said tail.

10. The improvement of claim 8 wherein said means for determining comprises:
    a display means; and
    digital processor means for controlling said sampling, for storing said samples, and for causing said display means to display said samples.

11. The improvement of claim 10 wherein said digital processor means is further operative to display at least one limit curve in conjunction with display of said samples.

12. A method of determining quality of bonds made by a bonder employing coupling of power to a bond site, comprising the steps of:
    providing an ultrasonic generator employing a feedback loop to control the application of ultrasonic energy to a bonding tool;
    generating a DC correction signal, said DC correction signal being generated by said feedback loop which signal is indicative of the changes in feedback required to stabilize the ultrasonic energy used to vibrate a bonding tool during the bonding process;
    sampling said DC correction signal;
    storing said samples; and
    analyzing said samples to determine bond quality.

13. The method of claim 12 wherein the bonder forms a ball bond followed by a second bond and a tail and said sampling step includes generating a first toggle signal indicative of the beginning of formation of a ball bond, a second toggle signal indicative of formation of a second bond after formation of the ball bond, and a third toggle signal indicative of formation and tear of a tail.

14. The method of claim 12 wherein said step of analyzing comprises comparing said samples to a limit function.

15. The method of claim 14 wherein said limit function comprises a heuristically determined curve.

16. The method of claim 14 wherein said step of analyzing further includes the step of automatically generating said limit function using a digital processor means.

17. The method of claim 16 wherein said step of comparing is performed by said digital processor means.

18. The method of claim 12 wherein said power coupled to the bond site includes power generated through application of ultrasonic energy to the bond site.

19. The method of claim 18 wherein said signal comprises a feedback signal produced in an ultrasonic generator.

* * * * *